US011315914B2

(12) United States Patent
Sung et al.

(10) Patent No.: US 11,315,914 B2
(45) Date of Patent: Apr. 26, 2022

(54) THREE-DIMENSIONAL SEMICONDUCTOR MEMORY DEVICE

(71) Applicant: SK hynix Inc., Icheon-si (KR)

(72) Inventors: Sang Hyun Sung, Cheongju-si (KR); Young Ki Kim, Icheon-si (KR); Jin Ho Kim, Hwaseongsi (KR); Byung Hyun Jun, Icheon-si (KR)

(73) Assignee: SK hynix Inc., Icheon-si (KR)

(*) Notice: Subject to any disclaimer, the term of this patent is extended or adjusted under 35 U.S.C. 154(b) by 93 days.

(21) Appl. No.: 16/890,653

(22) Filed: Jun. 2, 2020

(65) Prior Publication Data

US 2021/0210475 A1 Jul. 8, 2021

(30) Foreign Application Priority Data

Jan. 6, 2020 (KR) .................. 10-2020-0001707

(51) Int. Cl.
*H01L 27/11582* (2017.01)
*H01L 25/18* (2006.01)
*H01L 23/00* (2006.01)
*H01L 27/11573* (2017.01)
*H01L 23/528* (2006.01)

(52) U.S. Cl.
CPC ............ *H01L 25/18* (2013.01); *H01L 23/528* (2013.01); *H01L 24/05* (2013.01); *H01L 24/08* (2013.01); *H01L 27/11573* (2013.01); *H01L 27/11582* (2013.01); *H01L 2224/0557* (2013.01); *H01L 2224/08147* (2013.01); *H01L 2924/1431* (2013.01); *H01L 2924/14511* (2013.01)

(58) Field of Classification Search
CPC ....... H01L 25/18; H01L 23/528; H01L 24/05; H01L 24/08; H01L 27/11573; H01L 27/11582
See application file for complete search history.

(56) References Cited

U.S. PATENT DOCUMENTS

| 2013/0215684 | A1* | 8/2013 | Oh | .......................... | G11C 5/06 365/185.29 |
| 2016/0079164 | A1* | 3/2016 | Fukuzumi | ......... | H01L 21/76898 257/324 |
| 2017/0179154 | A1* | 6/2017 | Furihata | ............ | H01L 21/76802 |
| 2017/0194345 | A1* | 7/2017 | Nojima | ............. | H01L 27/11565 |
| 2017/0330887 | A1* | 11/2017 | Kim | .................. | H01L 27/11565 |

(Continued)

FOREIGN PATENT DOCUMENTS

| CN | 107658315 A | 2/2018 |
| CN | 107658317 A | 2/2018 |

*Primary Examiner* — Nathan W Ha

(57) ABSTRACT

A semiconductor memory device includes: a first pad layer in a surface of a memory chip including a cell region in which a memory cell array coupled to a plurality of row lines and a step region including staggered step portions of the plurality of row lines, and including a plurality of first pads that are coupled to the step portions; a second pad layer in a surface of a circuit chip bonded to the surface of the memory chip, and having a plurality of second pads coupled to a plurality of pass transistors defined in the circuit chip; a first redistribution line disposed in the first pad layer that couples one of the step portions and one of the pass transistors; and a second redistribution line disposed in the second pad layer that couples another one of the step portions and another one of the pass transistors.

17 Claims, 11 Drawing Sheets

(56) References Cited

U.S. PATENT DOCUMENTS

| | | | |
|---|---|---|---|
| 2018/0261623 A1* | 9/2018 | Higashi | H01L 29/7926 |
| 2018/0277477 A1* | 9/2018 | Ishihara | H01L 27/11573 |
| 2019/0081069 A1* | 3/2019 | Lu | H01L 27/11573 |
| 2019/0088589 A1* | 3/2019 | Zhu | H01L 27/1157 |
| 2019/0164991 A1* | 5/2019 | Lim | H01L 25/18 |
| 2020/0006371 A1* | 1/2020 | Huo | H01L 27/11575 |
| 2020/0185397 A1* | 6/2020 | Chibvongodze | H01L 27/11565 |
| 2020/0194416 A1* | 6/2020 | Or-Bach | H01L 27/11565 |
| 2020/0203329 A1* | 6/2020 | Kanamori | H01L 24/05 |
| 2020/0328180 A1* | 10/2020 | Cheng | H01L 25/0652 |
| 2020/0328186 A1* | 10/2020 | Liu | G11C 11/005 |
| 2020/0350014 A1* | 11/2020 | Liu | H01L 24/83 |
| 2021/0111137 A1* | 4/2021 | Chen | H01L 24/08 |
| 2021/0159216 A1* | 5/2021 | Wu | H01L 24/80 |
| 2021/0217478 A1* | 7/2021 | Oh | G11C 16/24 |

\* cited by examiner

THREE-DIMENSIONAL SEMICONDUCTOR MEMORY DEVICE

CROSS-REFERENCE TO RELATED APPLICATION

The present application claims priority under 35 U.S.C. § 119(a) to Korean Patent Application No. 10-2020-0001707 filed in the Korean Intellectual Property Office on Jan. 6, 2020, which is incorporated herein by reference in its entirety.

BACKGROUND

1. Technical Field

Various embodiments generally relate to a semiconductor memory device, and particularly, to a three-dimensional semiconductor memory device.

2. Related Art

In order to meet demands for excellent performance and low price that consumers demand, it is required to increase the degree of integration in a semiconductor device. Since the degree of integration of a two-dimensional or planar semiconductor memory device is mainly determined by the area occupied by a unit memory cell, the degree of integration is greatly influenced by the level of a fine pattern forming technique. However, since highly expensive equipment is required for the formation of a fine pattern, the degree of integration of a two-dimensional semiconductor memory device is still limited, although it is increasing. To overcome such limitations, alternatives include a three-dimensional semiconductor memory device including memory cells that are arranged in three dimensions has been proposed.

In a three-dimensional semiconductor memory device, the degree of integration may be increased by increasing the number of row lines (specifically, word lines) to be stacked. However, the number of wiring lines coupled to the row lines increases in proportion to the number of the row lines, thereby increasing the number of metal layers required for the disposition of the wiring lines.

SUMMARY

Various embodiments are directed to a semiconductor memory device capable of contributing to a reduction in the number of metal layers.

In an embodiment, a semiconductor memory device may include: a first pad layer in a surface of a memory chip including a cell region in which a memory cell array coupled to a plurality of row lines, alternately stacked with a plurality of interlayer dielectric layers, on a substrate and a step region, which extends from the cell region in a first direction parallel to a top surface of the substrate, including staggered step portions of the plurality of row lines, and including a plurality of first pads that are coupled to the step portions; a second pad layer in a surface of a circuit chip that is bonded to the surface of the memory chip, and having a plurality of second pads that are coupled to a plurality of pass transistors defined in the circuit chip; a first redistribution line disposed in the first pad layer that couples one of the step portions and one of the pass transistors; and a second redistribution line disposed in the second pad layer that couples another one of the step portions and another one of the pass transistors.

In an embodiment, a semiconductor memory device may include: a first pad layer provided in one surface of a memory chip including a cell region in which a memory cell array coupled to a plurality of row lines, alternately stacked with a plurality of interlayer dielectric layers, on a substrate and a step region, which extends from the cell region in a first direction parallel to a top surface of the substrate, and in which ends of the plurality of row lines project into the step region from the cell region in different lengths to define a plurality of staggered step portions coupled to a plurality of first pads; a second pad layer provided in one surface of a circuit chip that is bonded with the one surface of the memory chip, and having positioned therein a plurality of second pads that are respectively coupled to a plurality of pass transistors defined in the circuit chip; and a first redistribution line, disposed in the first pad layer or the second pad layer, that couples one of the plurality of step portions and one of the plurality of pass transistors.

In an embodiment, a semiconductor memory device may include: a memory chip, and a circuit chip bonded to the memory chip. The memory chip includes a plurality of row lines which are stacked to be separated from one another, and includes, in one surface thereof to which the circuit chip is bonded, a plurality of first pads that are coupled to the plurality of row lines, and a first redistribution line that is coupled to one of the plurality of first pads. The circuit chip includes a plurality of pass transistors, and includes, in one surface thereof that is bonded to the memory chip, a plurality of second pads that are coupled to the plurality of pass transistors, and a second redistribution line that is coupled to one of the plurality of second pads. The one of the plurality of first pads coupled to the first redistribution line is bonded with one of the plurality of second pads, and the one of the plurality of second pads is coupled to the second redistribution line is bonded with one of the plurality of first pads.

DETAILED DESCRIPTION

Figure 1:
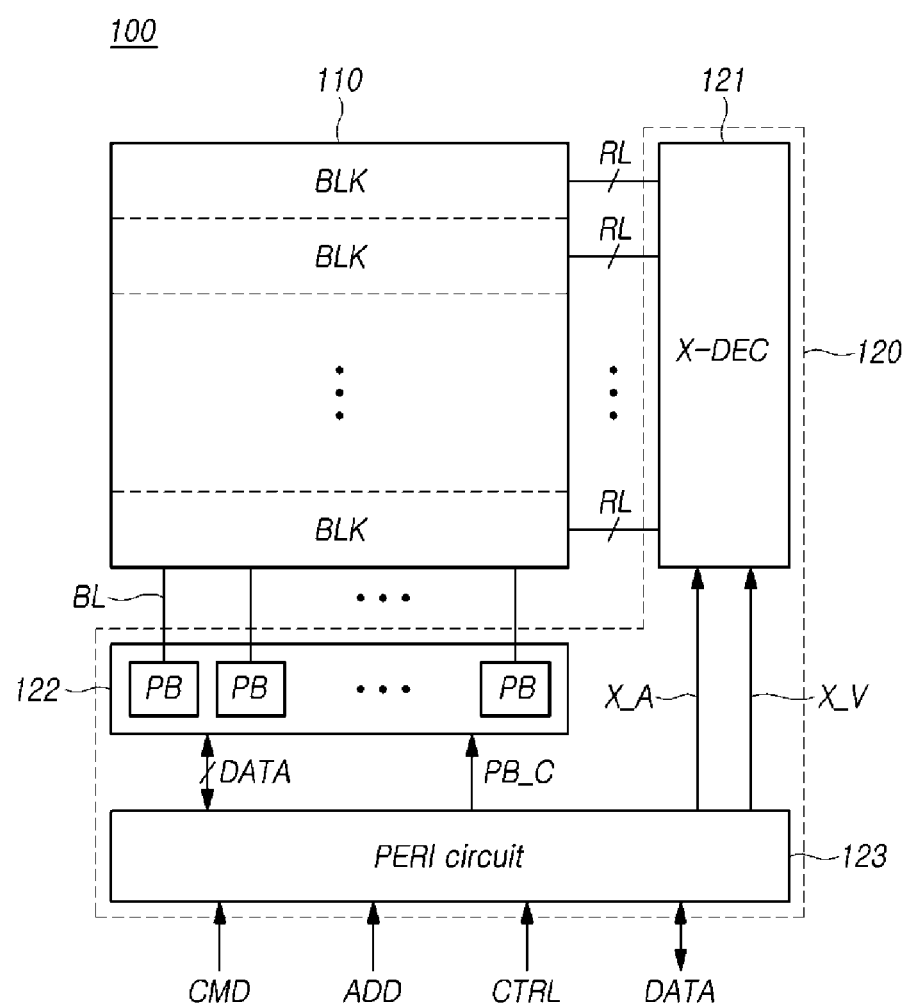
FIG. 1 is a block diagram illustrating a representation of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise. In interpreting elements in embodiments of the disclosure, they should be interpreted as including error margins even without explicit statements.

Also, in describing the components of the disclosure, there may be terms used like first, second, A, B, (a), and (b). These are solely for the purpose of differentiating one component from the other and do not imply or suggest the substances, order, sequence or number of the components. Also, elements in embodiments of the disclosure are not limited by these terms. Theses terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram illustrating an example of a semiconductor memory device in accordance with an embodiment of the disclosure.

Referring to FIG. 1, a semiconductor memory device 100 in accordance with an embodiment of the disclosure may include a memory cell array 110 and a logic circuit 120. The logic circuit 120 may include a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, which are coupled in series. While the following descriptions include embodiments that use vertical NAND flash memory, it is to be noted that the disclosure is not limited thereto.

The memory cell array 110 may be coupled to the row decoder 121 through a plurality of row lines RL. The row lines RL may include at least one drain select line, a plurality of word lines and at least one source select line. The memory cell array 110 may be coupled to the page buffer circuit 122 through a plurality of bit lines BL.

The row decoder 121 may select any one among the memory blocks BLK included in the memory cell array 110 in response to a row address X_A provided from the peripheral circuit 123. The row decoder 121 may transfer an operating voltage X_V, provided from the peripheral circuit 123, to row lines RL coupled to a memory block BLK that is selected from among the memory blocks BLK included in the memory cell array 110. In order to transfer operating voltages to the row lines RL, the row decoder 121 may include a plurality of pass transistors, which are coupled to the row lines RL. The number of the pass transistors included in the row decoder 121 may be proportional to the number of the memory blocks BLK and the number of row lines RL included in each memory block BLK. The operating voltage X_V as a high voltage should be provided to the word lines of the selected memory block BLK. In order to transfer the high voltage, the pass transistors may be configured by high-voltage transistors.

The page buffer circuit 122 may include a plurality of page buffers PB, which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data stored in a memory cell of the memory cell array 110 by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL based on the data signal DATA received from the peripheral circuit 123 in response to the page buffer control signal PB_C, and thereby, may write data in a memory cell of the memory cell array 110. The page buffer circuit 122 may write data in or read data from memory cells which are coupled to an activated word line.

The peripheral circuit 123 may receive a command signal CMD, an address signal ADD and a control signal CTRL from outside the semiconductor memory device 100, and may transmit and receive data DATA to and from a device outside the semiconductor memory device 100, such as for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL from outside the semiconductor memory device 100. The peripheral circuit 123 may generate various voltages including the operating voltage X_V, which are required in the semiconductor memory device 100.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a third direction TD. For example, the first direction FD may correspond to the extending direction of word lines or/and the arrangement direction of bit lines, and the second direction SD may correspond to the extending direction of the bit lines or/and the arrangement direction of the word lines. The first direction FD and the second direction SD may substantially perpendicularly intersect with each other. The third direction TD may correspond to a direction that is perpendicular to the first direction FD and the second direction SD. In the following descriptions, the term 'vertical' or 'vertical direction' will be used as substantially the same meaning as the third direction TD. In the drawings, a direction indicated by an arrow and a direction opposite thereto represent the same direction.

Figure 2:
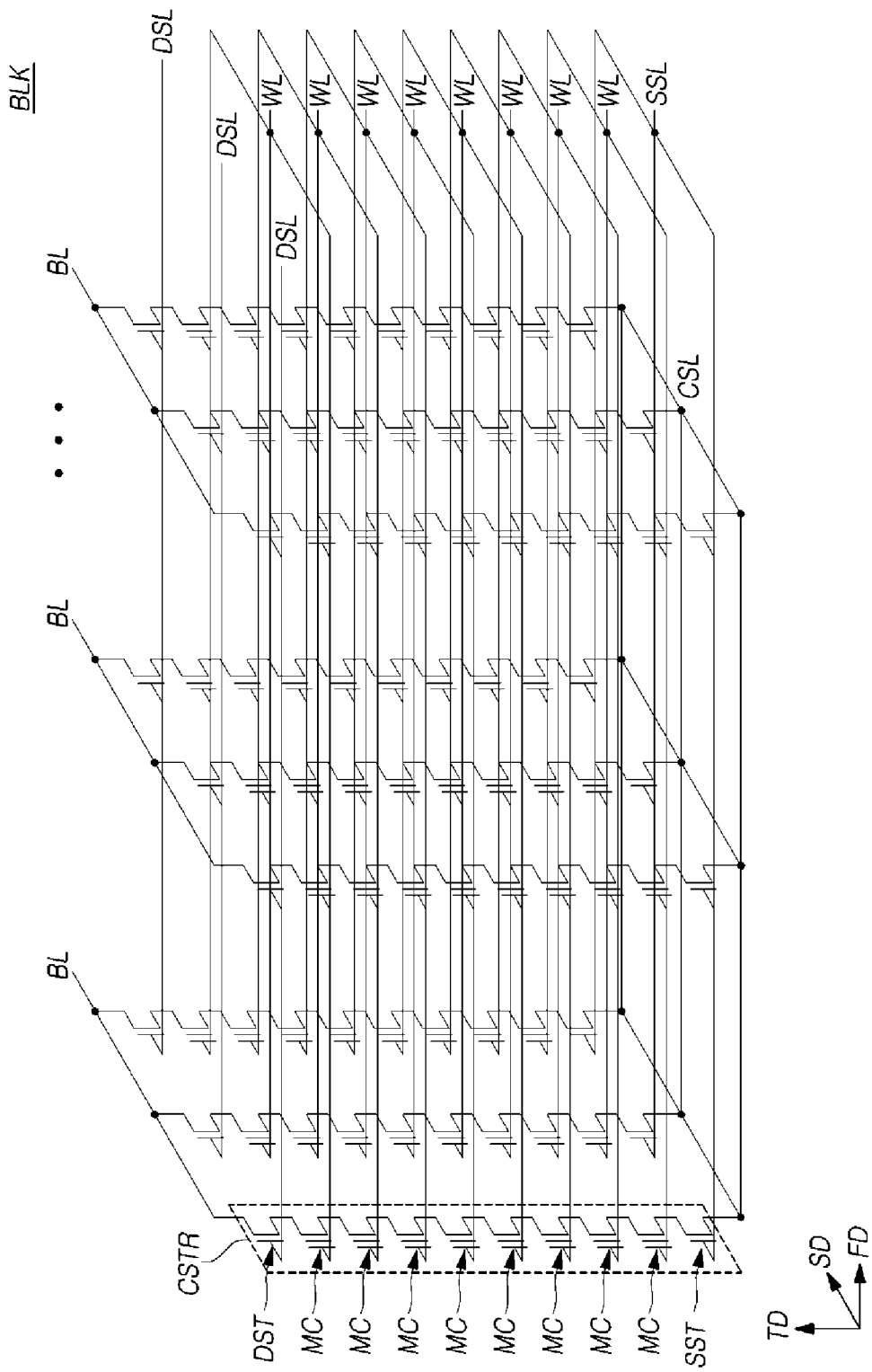
FIG. 2 is an equivalent circuit diagram illustrating a representation of one of memory blocks illustrated in FIG. 1.

FIG. 2 is an equivalent circuit diagram illustrating an example of one of the memory blocks BLK illustrated in FIG. 1.

Referring to FIG. 2, the memory block BLK may include a plurality of cell strings CSTR, which are coupled between a plurality of bit lines BL and a common source line CSL. The bit lines BL may extend in the second direction SD, and may be arranged in the first direction FD. A plurality of cell strings CSTR may be coupled in parallel to each of the bit lines BL. The cell strings CSTR may be coupled in common to the common source line CSL. The plurality of cell strings CSTR may be coupled between the plurality of bit lines BL and the one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series in the third direction TD.

Drain select lines DSL, a plurality of word lines WL and a source select line SSL may be stacked between the bit lines BL and the common source line CSL in the third direction TD. Each of the drain select lines DSL may be coupled to the gates of corresponding drain select transistors DST. Each of the word lines WL may be coupled to the gates of corresponding memory cells MC. The source select line SSL may be coupled to the gates of source select transistors SST. Memory cells MC which are coupled in common to one word line WL may configure one page.

Figure 3:
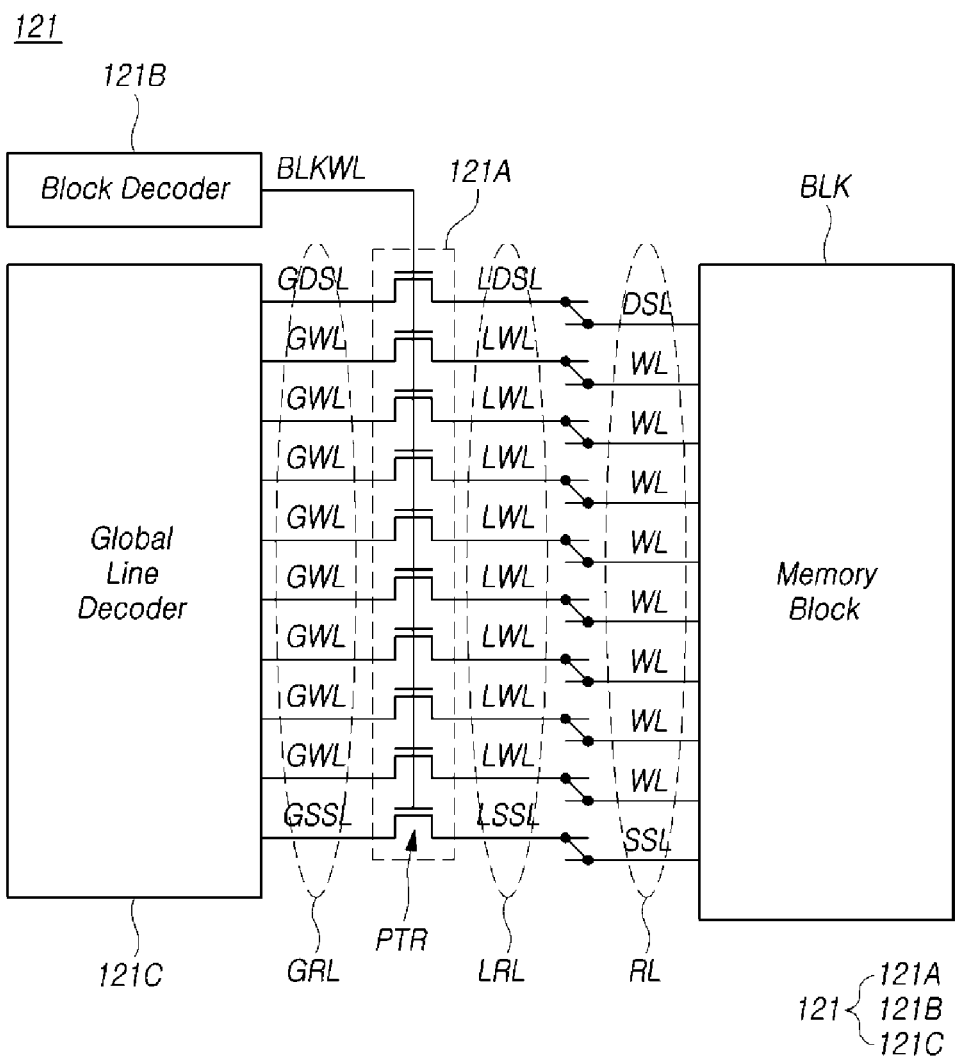
FIG. 3 is a block diagram illustrating a representation of a part of a row decoder illustrated in FIG. 1.

FIG. 3 is a block diagram illustrating an example of a part of a row decoder illustrated in FIG. 1.

Referring to FIG. 3, a row decoder 121 may include a pass transistor circuit 121A, a block decoder 121B and a global line decoder 121C.

A pass transistor circuit 121A may be provided for each memory block BLK. The block decoder 121B and the global line decoder 121C may be provided in common for a plurality of memory blocks BLK included in a memory cell array 110 (see FIG. 1). The pass transistor circuit 121A may be coupled to the row lines RL through local row lines LRL. The local row lines LRL may include at least one local drain select line LDSL, a plurality of local word lines LWL and at least one local source select line LSSL. The local drain select line LDSL may be coupled to a drain select line DSL. The local word lines LWL may be coupled to word lines WL, respectively. The local source select line LSSL may be coupled to a source select line SSL.

The pass transistor circuit 121A may include a plurality of pass transistors PTR, each coupled to a global row line GRL. Global row lines GRL may be coupled to the drains of the respective pass transistors PTR, and local row lines LRL may be coupled to the sources of pass transistors PTR, respectively.

The block decoder 121B may be coupled to the pass transistor circuit 121A through a block word line BLKWL. The block decoder 121B may be provided with a block select signal from a peripheral circuit 123 (see, e.g., FIG. 1), and may transfer the block select signal to the block word line BLKWL in response to a control signal from the peripheral circuit 123.

The global line decoder 121C may be coupled to the pass transistor circuit 121A through the global row lines GRL. The global line decoder 121C may be provided with operating voltages from the peripheral circuit 123, and may transfer the operating voltages to the global row lines GRL in response to a control signal from the peripheral circuit 123.

The pass transistors PTR may couple the global row lines GRL and the local row lines LRL in response to the block select signal of the block word line BLKWL. The pass transistors PTR may transfer the operating voltages, applied to the global row lines GRL, to the local row lines LRL, and accordingly may provide the operating voltages to the row lines RL of the memory block BLK.

Figure 4:
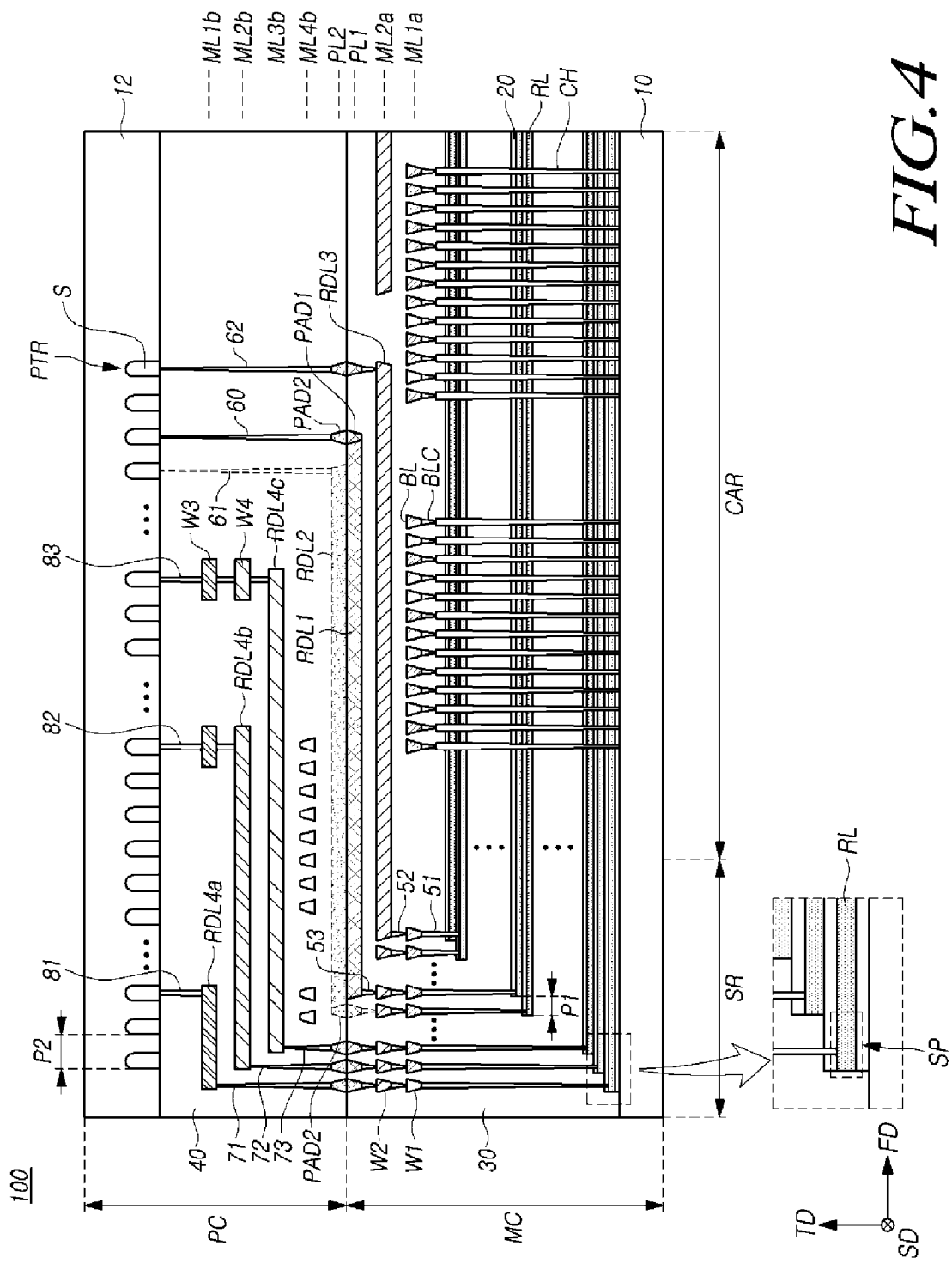
FIG. 4 is a cross-sectional view illustrating an example of a semiconductor memory device in accordance with an embodiment of the disclosure.

FIG. 4 is a cross-sectional view illustrating an example of a semiconductor memory device in accordance with an embodiment of the disclosure.

Referring to FIG. 4, a semiconductor memory device 100 in accordance with an embodiment of the disclosure may include a memory chip MC and a circuit chip PC, which is bonded onto the memory chip MC. The semiconductor memory device 100 may have a POC (peri over cell) structure.

The memory chip MC may include a plurality of row lines RL and a plurality of interlayer dielectric layers 20 which are alternately stacked on a first substrate 10. The first substrate 10 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. At least one layer from the lowermost layer among the row lines RL may configure a source select line. At least one layer from the uppermost layer among the row lines RL may configure a drain select line. The row lines RL between the source select line and the drain select line may configure word lines.

The semiconductor memory device 100 may include a cell region CAR and a step region SR, which extends in the first direction FD from the cell region CAR. A plurality of vertical channels CH, which pass through the row lines RL and the interlayer dielectric layers 20 may be defined in the cell region CAR. The vertical channels CH may pass through the row lines RL and the interlayer dielectric layers 20 in the third direction TD. While not illustrated, each of the vertical channels CH may include a channel layer and a gate dielectric layer. The channel layer may include polysilicon or monocrystalline silicon, and may include a P-type impurity such as boron (B) in some regions. The gate dielectric layer may have the shape of a straw or a cylindrical shell which surrounds the outer wall of the channel layer. The gate dielectric layer may include a tunnel dielectric layer, a charge storage layer and a blocking layer which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked. Source select transistors may be configured where the source select line surrounds the vertical channels CH, and memory cells may be configured where the word lines surround the vertical channels CH. Drain select transistors may be configured where the drain select line surrounds the vertical channels CH. The source select transistors, the memory cells and the drain select transistors may configure a memory cell array. The cell region CAR may be defined as a region in which the memory cell array is positioned or located.

In the step region SR, each of the row lines RL may have a step portion SP which projects in the first direction from an end of another row lines RL stacked over it. For instance, the row lines RL may extend from the cell region CAR into the step region SR in different lengths in the first direction FD to configure a step structure in the step region SR. The length of the upper row line extending into the step region SR may be shorter than the length of the lower row line extending into the step region SR, so as that the upper row line exposes the step portion SP of the lower row line. The step portions SP of the row lines RL may create staggered ends in the step region SR. The step region SR may be defined as a region in which the step portions SP of the row lines RL are positioned or disposed.

A dielectric layer 30 may be defined on the first substrate 10 to cover the row lines RL, the interlayer dielectric layers 20 and the vertical channels CH. The top surface of the dielectric layer 30 may configure a surface of the memory chip MC that is bonded with the circuit chip PC. A plurality of metal layers ML1a and ML2a may be defined in the dielectric layer 30. A first pad layer PL1 may be defined common to a top surface of the dielectric layer 30. In the third direction TD, the metal layer ML2a may be disposed above the metal layer ML1a, and the first pad layer PL1 may be disposed above the metal layer ML2a.

In the cell region CAR, a plurality of bit lines BL may be defined in the metal layer ML1a. Bit line contacts BLC may be defined under the bit lines BL to couple the bit lines BL and the vertical channels CH. A plurality of wiring lines W1 may be defined in the metal layer ML1a in the step region SR. Contacts 51 may be defined under the wiring lines W1 to couple the wiring lines W1 and the step portions SP of the row lines RL. In the step region SR, a plurality of wiring lines W2 may be defined in the metal layer ML2a, together with contacts 52 that may be defined under the wiring lines W2 to couple wiring lines W2 to wiring lines W1. A contact 52 may couple a first end of a third redistribution line RDL3 to a wiring line W1 in the step region SR. The third redistribution line RDL3 may extend in the first direction FD into cell region CAR, or may remain in step region SR.

FIG. 4 illustrates a structure in which the row lines RL defined in the memory chip MC are coupled to pass transistors PTR defined in the circuit chip PC. A plurality of first pads PAD1, which are coupled to the step portions SP of the row lines RL, may be disposed in the first pad layer PL1.

The circuit chip PC may include the plurality of pass transistors PTR, which are defined on a second substrate 12. The reference symbol S of FIG. 4 denotes the source region of each pass transistor PTR. Although not illustrated, various elements which configure a logic circuit (such as, e.g., logic circuit 120 of FIG. 1) may be disposed on the second substrate 12 in addition to the pass transistors PTR.

The second substrate 12 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The circuit chip PC and the memory chip MC are bonded with each other after being fabricated on separate wafers. The second substrate 12 may be made of the same material as the first substrate 10.

A dielectric layer 40 may be defined on the second substrate 12 to cover the pass transistors PTR. The top surface of the dielectric layer 40 may configure a surface of the circuit chip PC that is bonded with the memory chip MC. A plurality of metal layers ML1b to ML4b may be defined in the dielectric layer 40. A second pad layer PL2 may be defined common to the top surface of the dielectric layer 40. In the third direction TD, a metal layer ML2b may be disposed above a metal layer ML1b, a metal layer ML3b may be disposed above the metal layer ML2b, and a metal layer ML4b may be disposed above the metal layer ML3b. The second pad layer PL2 may be disposed above the metal layer ML4b. A plurality of second pads PAD2, which are coupled to the sources S of the pass transistors PTR, may be defined in the second pad layer PL2.

The first pads PAD1 of the memory chip MC and the second pads PAD2 of the circuit chip PC may be made of, for example, copper or a copper alloy. When the memory chip MC and the circuit chip PC are bonded with each other, the first pads PAD1 and the second pads PAD2 corresponding to each other may be coupled. For example, coupling the first pads PAD1 and the second pads PAD2 with each other results from contacting the one surface of the memory chip MC, in which the first pads PAD1 are positioned, with the one surface of the circuit chip PC, in which the second pads PAD2 are positioned, such that the first pads PAD1 and the second pads PAD2 contact each other, and bonding the memory chip MC and the circuit chip PC at a temperature of 300 to 400° C. under a predetermined pressure.

The pass transistors PTR may be configured by high-voltage transistors. Each of the high-voltage transistors configuring the pass transistors PTR requires a wider area than a low voltage transistor in order to withstand a high voltage. That is to say, each of the high-voltage pass transistors PTR needs to be fabricated in a relatively greater size in order to transfer the high voltage. In order to reduce the size of the semiconductor memory device 100, it is necessary to reduce the length of the step region SR in the first direction FD. To this end, it is necessary to reduce the length of the step portion SP of each row line RL in the first direction FD. For example, the length of the step portion SP of each row line RL in the first direction FD may have a minimum feature size that is required for landing each contact 51. For this reason, the pitch of the step portions SP of the row lines RL in the first direction FD may be smaller than the pitch of the pass transistors PTR in the first direction FD. For instance, the pitch of the step portions SP of the row lines RL in the first direction FD may have a first size P1, and the pitch of the pass transistors PTR in the first direction FD may have a second size P2, which is larger than the first size P1.

Due to the difference in pitch between the step portions SP and the pass transistors PTR, the step portion SP of each row line RL and a pass transistor PTR coupled thereto may be spaced apart from each other in the first direction FD when viewed from the top or in a plan view. The step portion SP of a row line and its corresponding pass transistor PTR might not overlap with each other in the third direction TD. In order to couple the step portion SP and corresponding the pass transistor PTR that do not overlap with each other in the third direction TD, a redistribution line extending in a direction parallel to a top surface of the first substrate 10 needs to be provided.

As illustrated in FIG. 4, a first redistribution line RDL1 may be defined in the first pad layer PL1 of the memory chip MC to couple one of the step portions SP of the row lines RL and one of the pass transistors PTR. A second redistribution line RDL2 may be defined in the second pad layer PL2 of the circuit chip PC to couple another one of the step portions SP of the row lines RL and another one of the pass transistors PTR.

As explained further below with reference to FIGS. 5, 7 and 9, the first redistribution line RDL1 may be disposed in the first pad layer PL1 in areas remaining after the first pads PAD1 are disposed. The first redistribution line RDL1 may be formed together with the first pads PAD1 in the same manufacturing step, and may be made of the same material as the first pads PAD1.

A first end of the first redistribution line RDL1 may overlap with a step portion SP in the third direction TD. A contact 53 may be defined under the first end of the first redistribution line RDL1 to couple the wiring line W2, which is coupled to the corresponding step portion SP, and the first redistribution line RDL1. The first end of the first redistribution line RDL1 may be coupled to the step portion SP through wiring lines W1 and W2, and through contacts 51 to 53, which are defined on the step portion SP. The other end of the first redistribution line RDL1 may be coupled to one of the first pads PAD1. The first pad PAD1 may overlap with the one of the pass transistors PTR in the third direction TD, and may be coupled to the source region S of the one pass transistor PTR through a second pad PAD2 and a contact 60. Although only one first redistribution line RDL1 is illustrated in FIG. 4, it is to be understood that in other embodiments, two or more first redistribution lines RDL1 are disposed in the first pad layer PL1.

The second redistribution line RDL2 may be disposed in the second pad layer PL2 in remaining areas after the second pads PAD2 are disposed. The second redistribution line RDL2 may be formed together with the second pads PAD2 in the same manufacturing step, and may be made of the same material as the second pads PAD2.

A first end of the second redistribution line RDL2 may overlap with source region S of a corresponding pass transistor PTR in the third direction TD, and may be coupled to the source region S of the pass transistor PTR through a contact 61. The other end of the second redistribution line RDL2 may be coupled to one of the second pads PAD2. The second pad PAD2, which is coupled to the second redistribution line RDL2, may overlap with the one of the step portions SP of the row lines RL in the third direction TD, and may be coupled to the step portion SP through a first pad PAD1, wiring lines W1 and W2 and contacts 51 to 53. Although only one second redistribution line RDL2 is illustrated in FIG. 4, it is to be understood that in other embodiments, two or more second redistribution lines RDL2 are disposed in the second pad layer PL2.

The third redistribution line RDL3 may be defined in the metal layer ML2a of the memory chip MC to couple the step portion SP of a row line RL and the source region S of a pass transistor PTR. One end of the third redistribution line RDL3 in the step region SR may overlap with the step portion SP of the row line RL, and may be coupled to the step portion SP of the row line RL through a wiring line W1 and contacts 51 and 52. The other end of the third redistribution line RDL3 may overlap with the source region S of the pass transistor PTR in the third direction TD, and may be coupled to the source region S of the pass transistor PTR through a contact 53, a first pad PAD1, a second pad PAD2 and a contact 62. The other end of the third redistribution line RDL3 may be disposed in either the step region SR or the cell region CAR.

Fourth redistribution lines RDL4a, RDL4b and RDL4c (RDL4a to RDL4c) may be defined in the metal layers ML1b to ML3b of the circuit chip PC. Fourth redistribution lines (RDL4a to RDL4c) each couple a step portion SP of a row line RL to a corresponding a source region S of a pass transistor PTR.

One end of each of the fourth redistribution lines RDL4a to RDL4c may overlap with a step portion SP of a row line RL in the third direction TD, and may be coupled to a corresponding step portion SP of a row line RL through a contact 71, 72 or 73, respectively, and through a second pad PAD2, a first pad PAD1, wiring lines W1 and W2 and contacts 51 to 53. The other end of each of the fourth redistribution lines RDL4a to RDL4c may overlap with a corresponding source region S of a pass transistor PTR in the third direction TD, and may be coupled to the source region S of the pass transistor PTR through a respective contact 81, 82 or 83 and at least one of wiring lines W3 and W4.

The step portions SP that are coupled to the first and second redistribution lines RDL1 and RDL2 may be disposed farther from the cell region CAR in the first direction than the step portion SP which is coupled to the third redistribution line RDL3. The step portions SP that are coupled to the first and second redistribution lines RDL1 and RDL2 may be disposed closer to the cell region CAR in the first direction than the step portions SP that are coupled to the fourth redistribution lines RDL4a to RDL4c.

Among the redistribution lines RDL1, RDL2, RDL3 and RDL4a to RDL4c, a redistribution line with the shortest vertical distance (i.e., in the third direction) from the second substrate 12 may be coupled to a step portion SP that is positioned relatively farthest from the cell region CAR in the first direction FD. Among the redistribution lines RDL1, RDL2, RDL3 and RDL4a to RDL4c, a redistribution line of with the longest vertical distance from the second substrate 12 may be coupled to a step portion SP which is positioned relatively closest to the cell region CAR in the first direction FD. For example, the fourth redistribution line RDL4a may be coupled to a step portion SP which is disposed farthest from the cell region CAR, and the third redistribution line RDL3 may be coupled to a step portion SP which is disposed closest to the cell region CAR. Such a coupling scheme may reduce a phenomenon (a wiring line bottleneck phenomenon) in which wiring lines and contacts coupled to the step portions SP of the row lines RL are densely disposed in a specific section.

Figure 5:
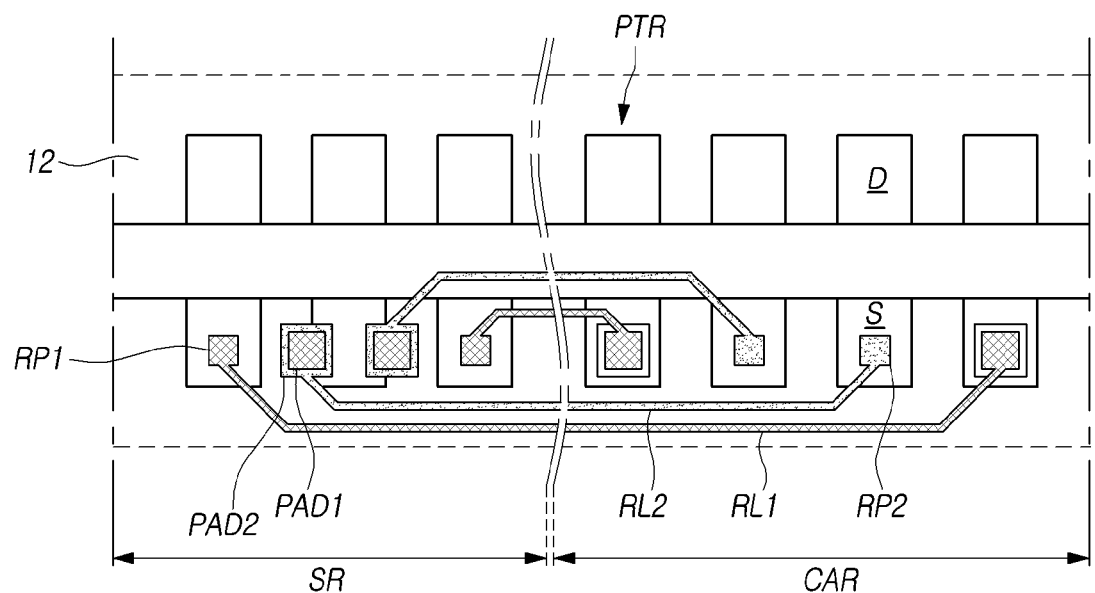
FIG. 5 is a top view illustrating an example of a partial configuration of FIG. 4.
Figure 5:
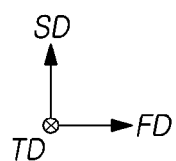
Figure 5:
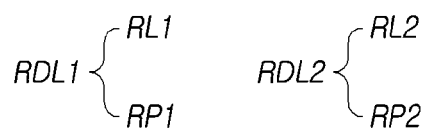

FIG. 5 is a top view illustrating an example of a partial configuration of FIG. 4, including some of the pass transistors PTR, the first and second pads PAD1 and PAD2 and the first and second redistribution lines RDL1 and RDL2.

Referring to FIGS. 4 and 5, the first redistribution line RDL1 may include a first landing pad portion RP1 and a first line portion RL1. The first landing pad portion RP1 may overlap with a step portion SP of a row line RL in the third direction TD. The first landing pad portion RP1 may be coupled to a top end of a contact 53, and may be coupled to the step portion SP through contacts 51, 52 and 53, and wiring lines W1 and W2.

As illustrated in FIG. 5, the first line portion RL1 may couple a first pad PAD1 in cell region CAR and the first landing pad portion RP1 in step region SR. One end of the first line portion RL1 may be coupled to the first landing pad portion RP1 in the step region SR, and the other end of the first line portion RL1 may be coupled to one of the first pads PAD1 in cell region CAR.

The second redistribution line RDL2 may include a second landing pad portion RP2 and a second line portion RL2. The second landing pad portion RP2 may overlap with a source region S of a pass transistor PTR in the third direction TD. The second landing pad portion RP2 may be coupled to a top end of a contact 61, and may be coupled to the source region S of the pass transistor PTR through the contact 61. The second line portion RL2 may couple a second pad PAD2 and the second landing pad portion RP2. One end of the second line portion RL2 may be coupled to the second pads PAD2 in the step region SR, and the other end of the second line portion RL2 may be coupled to the second landing pad portion RP2 in the cell region CAR.

The surface of the memory chip MC in which the first redistribution line RDL1 is positioned or disposed in a first pad layer PL1 and the surface of the circuit chip PC in which the second redistribution line RDL2 is positioned or disposed in a second pad layer PL2 are bonded with each other. If the first redistribution line RDL1 and the second redistribution line RDL2 overlap with each other in the third direction TD, then the first redistribution line RDL1 and the second redistribution line RDL2 will be shorted to each other. In order to prevent the first redistribution line RDL1 and the second redistribution line RDL2 from being shorted to each other, the first redistribution line RDL1 and the second redistribution line RDL2 may be configured so that they do not overlap with each other in the third direction TD. For example, the top surface of the first redistribution line RDL1 may be disposed to be in contact with the top surface of the dielectric layer 40 of the circuit chip PC, and the top surface of the second redistribution line RDL2 may be disposed to be in contact with the top surface of the dielectric layer 30 of the memory chip MC.

The embodiment described above with reference to FIGS. 4 and 5 illustrates an example in which redistribution lines are provided in both the first pad layer PL1 of the memory chip MC and the second pad layer PL2 of the circuit chip PC, but it is to be noted that redistribution lines may be provided in only one of the first pad layer PL1 of the memory chip MC and the second pad layer PL2 of the circuit chip PC. Such a structure will be described below with reference to FIGS. 6 to 9.

Figure 6:
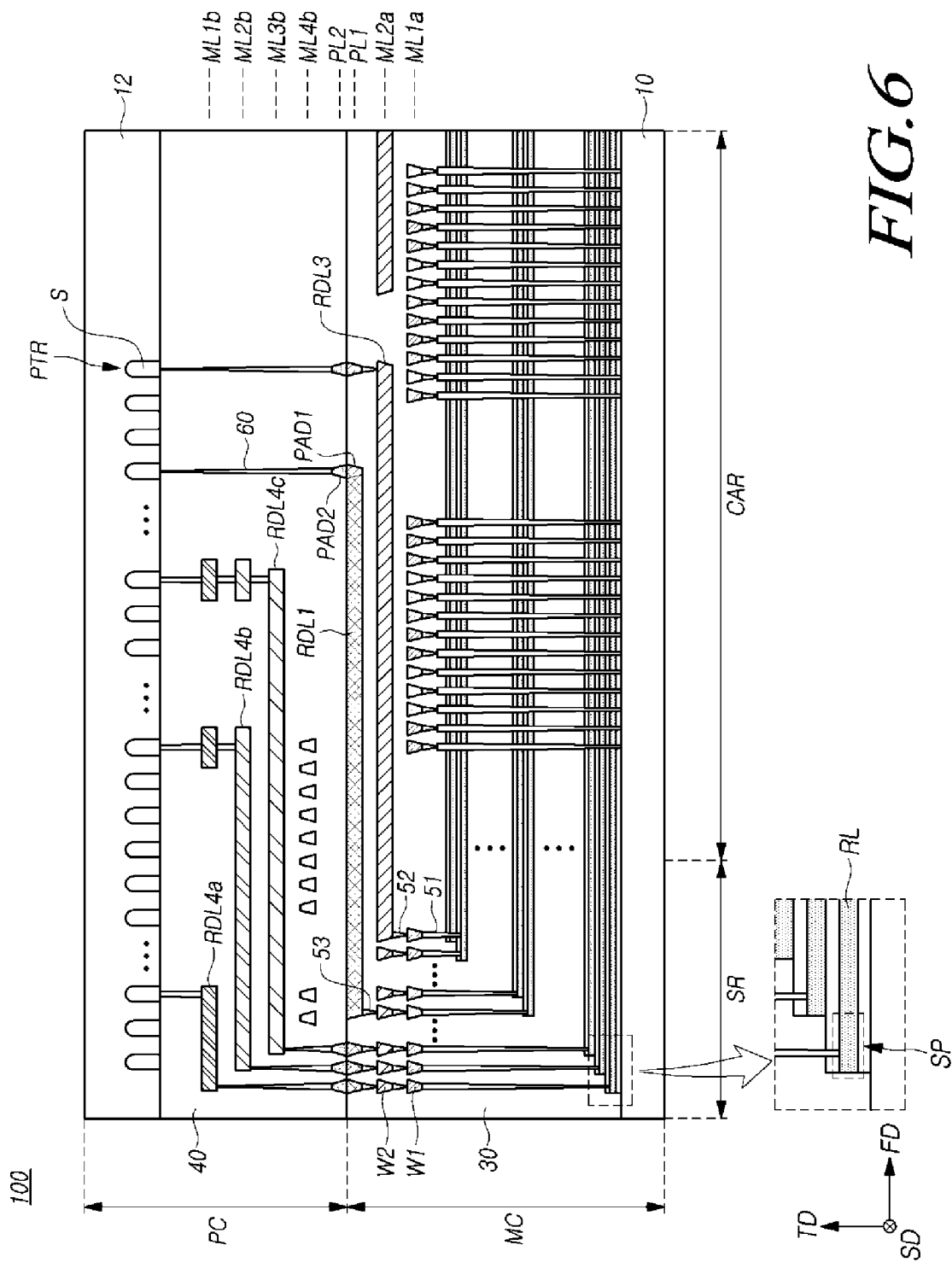
FIG. 6 is a cross-sectional view illustrating an example of a semiconductor memory device in accordance with another embodiment of the disclosure.

FIG. 6 is a cross-sectional view illustrating an example of a semiconductor memory device in accordance with another embodiment of the disclosure.

Referring to FIG. 6, a redistribution line RDL1 may be defined in the first pad layer PL1 of the memory chip MC. The redistribution line RDL1 may be formed together with the first pads PAD1 in the same manufacturing step, and may be made of the same material as the first pads PAD1.

One end of the redistribution line RDL1 may overlap with one of the step portions SP of the row lines RL in the third direction TD in the step region SR, and may be coupled to the step portion SP through wiring lines W1 and W2 and contacts 51, 52 and 53. The other end of the redistribution line RDL1 may be coupled to one of the first pads PAD1. The first pad PAD1 coupled with the redistribution line RDL1 may overlap with a source region S of a pass transistor PTR in the third direction TD, and may be coupled to the source region S of the pass transistor PTR through a second pad PAD2 and a contact 60.

The step portion SP that is coupled to the redistribution line RDL1 may be disposed farther from the cell region CAR than a step portion SP which is coupled to a third redistribution line RDL3. The step portion SP which is coupled to the redistribution line RDL1 may be disposed closer to the cell region CAR than step portions SP that are coupled to fourth redistribution lines RDL4a, RDL4b, and RDL4c.

Figure 7:
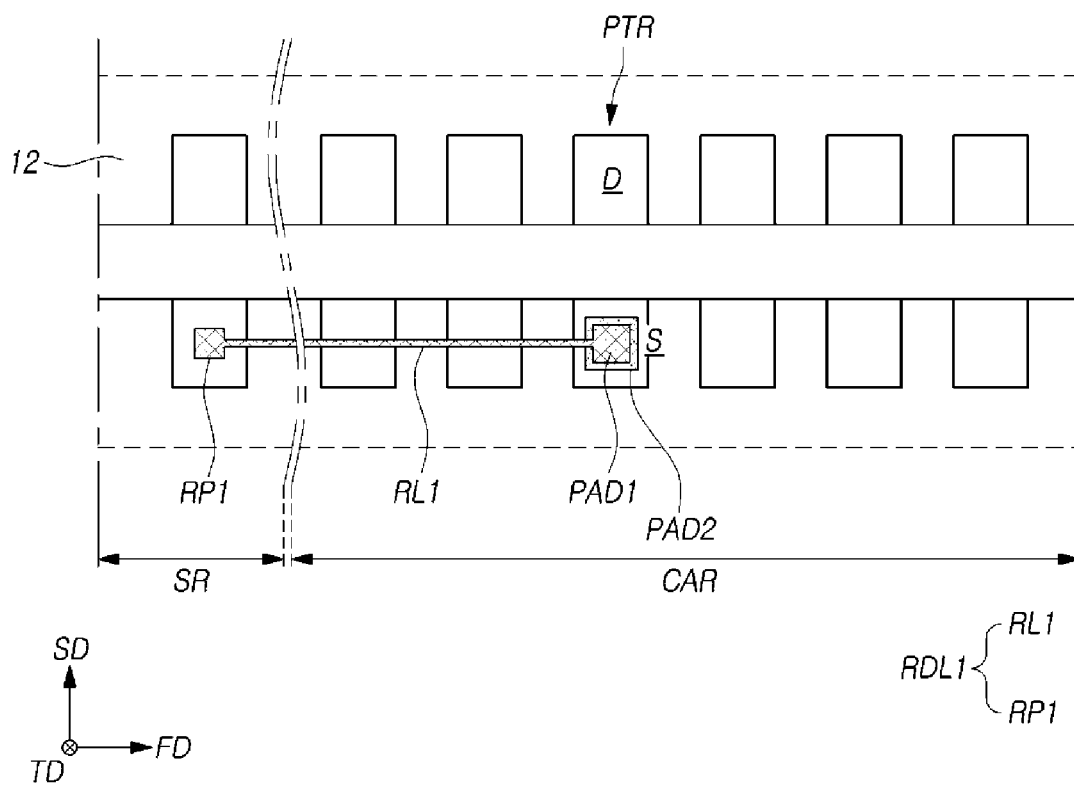
FIG. 7 is a top view illustrating an example of a partial configuration of FIG. 6.

FIG. 7 is a top view illustrating an example of a partial configuration of FIG. 6, including some of the pass transistors PTR, the first and second pads PAD1 and PAD2 and the redistribution line RDL1 of FIG. 6.

Referring to FIGS. 6 and 7, the redistribution line RDL1 may include a landing pad portion RP1 and a line portion RL1. The landing pad portion RP1 may be disposed to overlap with one of the step portions SP of the row lines RL in the third direction TD in the step region SR. The landing pad portion RP1 may be coupled to a top end of a contact 53, and may be coupled to the step portion SP through contacts 51, 52 and 53 and wiring lines W1 and W2. The line portion RL1 may couple a first pad PAD1 and the landing pad portion RP1. One end of the line portion RL1 may be coupled to the landing pad portion RP1 in the step region SR, and the other end of the line portion RL1 may be coupled to a first pad PAD1 in cell region CAR.

Figure 8:
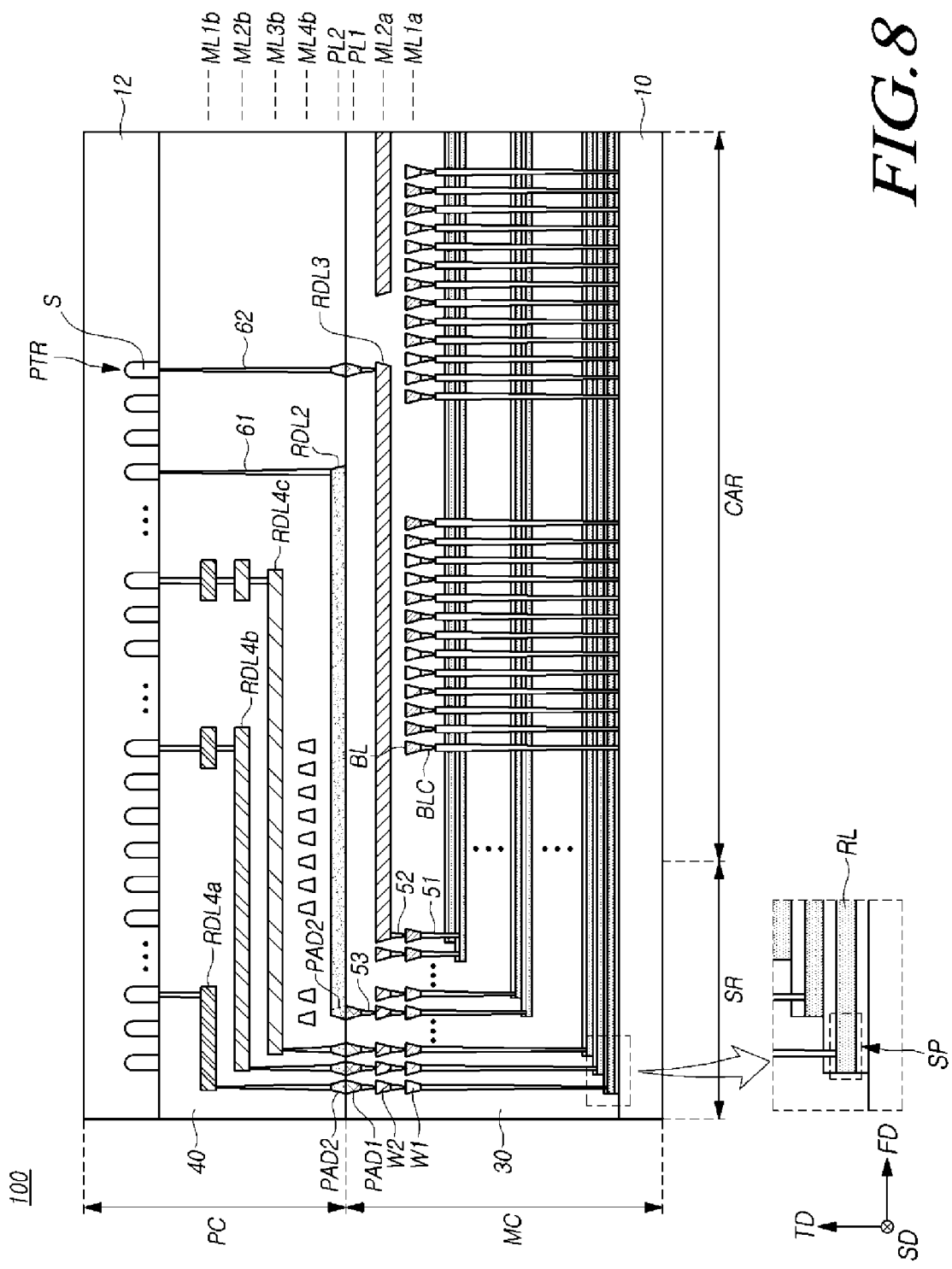
FIG. 8 is a cross-sectional view illustrating an example of a semiconductor memory device in accordance with still another embodiment of the disclosure.

FIG. 8 is a cross-sectional view illustrating an example of a semiconductor memory device in accordance with still another embodiment of the disclosure.

Referring to FIG. 8, a redistribution line RDL2 may be defined in a second pad layer PL2 of a circuit chip PC to couple a step portion SP and a source region S of a pass transistor PTR. The redistribution line RDL2 may be formed together with the second pads PAD2 in the same manufacturing step, and may be made of the same material as the second pads PAD2.

One end of the redistribution line RDL2 may be coupled to one of the second pads PAD2 in the step region SR. The second pad PAD2, which is coupled to the one end of the redistribution line RDL2, may overlap with one of the step portions SP of the row lines RL in the third direction TD, and may be coupled to the one step portion SP through a first pad PAD1, wiring lines W1 and W2 and contacts 51, 52 and 53. The other end of the redistribution line RDL2 may overlap with a source region S of a pass transistor PTR in the third direction TD, and may be coupled to the source region S of the pass transistor PTR through a contact 61.

The step portion SP that is coupled to the redistribution line RDL2 may be disposed farther from the cell region CAR than a step portion SP which is coupled to a third redistribution line RDL3. The step portion SP which is coupled to the redistribution line RDL2 may be disposed closer to the cell region CAR than step portions SP that are coupled to fourth redistribution lines RDL4a, RDL4b and RDL4c.

Figure 9:
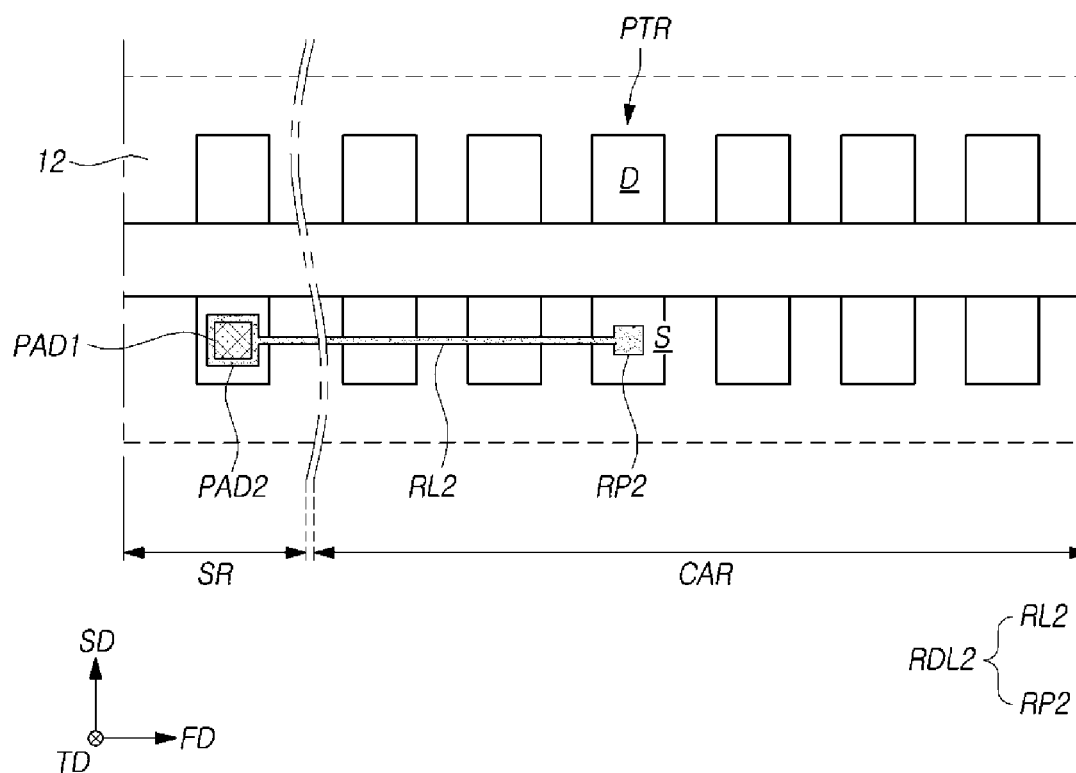
FIG. 9 is a top view illustrating a representation of a partial configuration of FIG. 8.

FIG. 9 is a top view illustrating a representation of a partial configuration of FIG. 8, including some of the pass transistors PTR, the first and second pads PAD1 and PAD2 and the redistribution line RDL2 of FIG. 8.

Referring to FIGS. 8 and 9, the redistribution line RDL2 may include a landing pad portion RP2 and a line portion RL2. The landing pad portion RP2 may overlap with a source region S of a pass transistor PTR in the third direction TD. The landing pad portion RP2 may be coupled to the top end of the contact 61 illustrated in FIG. 8, and may be coupled to the source region S of the pass transistor PTR through the contact 61. The line portion RL2 may couple a second pad PAD2 and the landing pad portion RP2. One end of the line portion RL2 may be coupled to the second pad PAD2 in the step region SR, and the other end of the line portion RL2 may be coupled to the landing pad portion RP2 in cell region CAR.

Hereafter, effects according to the embodiments of the disclosure will be described.

As the stack number of row lines RL increases to provide larger capacity and high integration in a semiconductor memory device, the number of pass transistors PTR and the number of redistribution lines which couple the pass transistors PTR and the row lines RL must also increase accordingly. In order to dispose the redistribution lines, a method of increasing the numbers of metal layers of a circuit chip PC or/and a memory chip MC may be used. In this case, as the number of manufacturing steps required for forming the metal layers increases, manufacturing time and manufacturing costs may increase, and the probability of a failure occurring during a manufacturing process may increase.

If the number of memory blocks is reduced, then the number of row lines RL and the number of pass transistors PTR may be reduced, and the number of redistribution lines which couple the pass transistors PTR and the row lines RL may be reduced. However, if the number of memory blocks is reduced while the capacity of a semiconductor memory device is maintained, then the number of cell strings included in each memory block increases, and the parasitic capacitance between the cell strings and the row lines RL may increase, leading to degraded operation characteristics in the semiconductor memory device.

According to the embodiments of the disclosure, by configuring redistribution lines in extra spaces on the pad layer of the circuit chip PC or/and the pad layer of the memory chip MC that remain or are available around contact pads, it is possible to reduce the number of metal layers required for the disposition of redistribution lines without reducing the number of memory blocks. Therefore, by simplifying a process through reducing the number of manufacturing steps necessary for forming metal layers, without degradation in the operation characteristics of a semiconductor memory device, a manufacturing cost may be reduced, and the number of failures likely to occur during a manufacturing process may be reduced.

Figure 10:
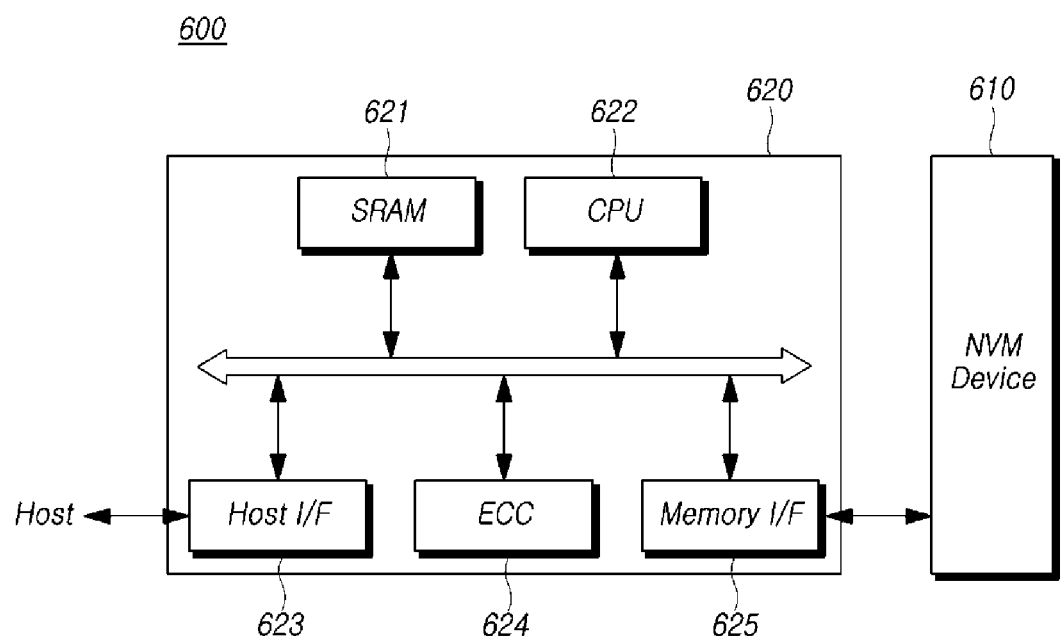
FIG. 10 is a diagram schematically illustrating a memory system including a semiconductor memory device in accordance with an embodiment of the disclosure.

FIG. 10 is a block diagram schematically illustrating a representation of an example of a memory system including a semiconductor memory device in accordance with an embodiment.

Referring to FIG. 10, a memory system 600 in accordance with an embodiment may include a nonvolatile memory device 610 and a memory controller 620.

The nonvolatile memory device (NVM Device) 610 may be constituted by the semiconductor memory device described above and may operate in the manner described above. The memory controller 620 may be configured to control the nonvolatile memory device 610. By the combination of the nonvolatile memory device 610 and the memory controller 620, a memory card or a solid state disk (SSD) may be provided. An SRAM (Static Random Access Memory) 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device 610.

A memory interface (Memory I/F) 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 11:
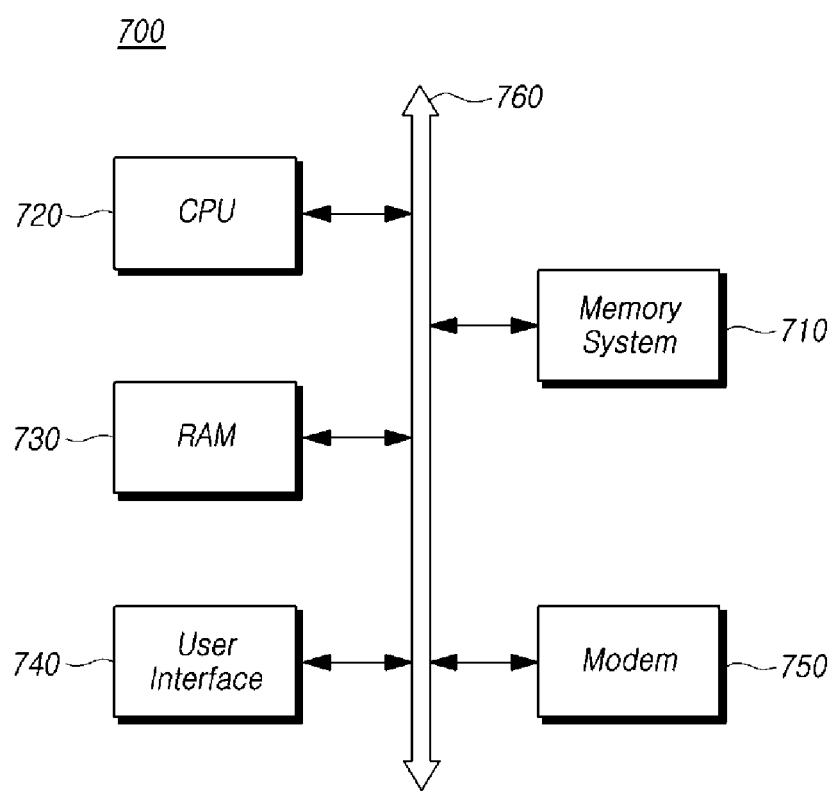
FIG. 11 is a block diagram schematically illustrating a representation of an example of a computing system including a semiconductor memory device in accordance with an embodiment of the disclosure.

FIG. 11 is a block diagram schematically illustrating a representation of an example of a computing system including a semiconductor memory device in accordance with an embodiment.

Referring to FIG. 11, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A semiconductor memory device comprising:
a first pad layer in a surface of a memory chip including a cell region in which a memory cell array coupled to a plurality of row lines, alternately stacked with a plurality of interlayer dielectric layers, on a substrate and a step region, which extends from the cell region in a first direction parallel to a top surface of the substrate, including staggered step portions of the plurality of row lines, the first pad layer includes a plurality of first pads that are coupled to the step portions;
a second pad layer in a surface of a circuit chip that is bonded to the surface of the memory chip, and having a plurality of second pads that are coupled to a plurality of pass transistors defined in the circuit chip;
a first redistribution line disposed in the first pad layer that couples one of the step portions and one of the pass transistors;
a second redistribution line disposed in the second pad layer that couples another one of the step portions and another one of the pass transistors; and
a third redistribution line in an internal metal layer of the memory chip, that couples another of the plurality of pass transistors and another of the step portions,
wherein the step portions coupled to the first and second redistribution lines are disposed farther from the cell region than the another of the step portions coupled to the third redistribution line.

2. The semiconductor memory device according to claim 1, wherein the first redistribution line and the second redistribution line do not overlap in a direction perpendicular to the top surface of the substrate.

3. The semiconductor memory device according to claim 1, wherein a pitch of the step portions in the first direction is smaller than a pitch of the pass transistors in the first direction.

4. The semiconductor memory device according to claim 1, wherein the first redistribution line extends in the first direction to couple the step portion in the step region and the pass transistor in the cell region, and the second redistribution line extends in the first direction to couple the step portion and the pass transistor in the cell region.

5. The semiconductor memory device according to claim 1, wherein the first redistribution line comprises:
a land portion coupled to a contact extending in a direction that is perpendicular to the top surface of the substrate, wherein the contact is coupled to one of the step portions; and
a line portion that couples one of the plurality of first pads to the land portion.

6. The semiconductor memory device according to claim 1, wherein the second redistribution line comprises:
a land portion coupled to one of the plurality of pass transistors in a direction that is perpendicular to the top surface of the substrate; and a line portion that couples one of the plurality of second pads to the land portion.

7. The semiconductor memory device according to claim 1, wherein the first redistribution line is made of the same material as the first pads.

8. The semiconductor memory device according to claim 1, wherein the second redistribution line is made of the same material as the second pads.

9. The semiconductor memory device according to claim 1, further comprising:
a fourth redistribution line in an internal metal layer of the circuit chip, couples another of the plurality of pass transistors and another of the step portions,
wherein the step portions coupled to the first and second redistribution lines are disposed closer to the cell region than the another of the step portions coupled to the fourth redistribution line.

10. A semiconductor memory device comprising:
a first pad layer provided in one surface of a memory chip including a cell region in which a memory cell array is coupled to a plurality of row lines, alternately stacked with a plurality of interlayer dielectric layers, on a substrate and a step region which extends from the cell region in a first direction parallel to a top surface of the substrate, and in which ends of the plurality of row lines project into the step region from the cell region in different lengths to define a plurality of staggered step portions, the first pad layer includes a plurality of first pads that are coupled to the step portions;
a second pad layer provided in one surface of a circuit chip that is bonded with the one surface of the memory chip, and having positioned therein a plurality of second pads that are respectively coupled to a plurality of pass transistors defined in the circuit chip;
a first redistribution line, disposed in the first pad layer or the second pad layer, that couples one of the plurality of step portions and one of the plurality of pass transistors;
a second redistribution line, disposed in a metal layer inside the memory chip, that couples another of the plurality of step portions, except the step portion coupled to the first redistribution line, and another of the plurality of pass transistors, except the pass transistor coupled to the first redistribution line,
wherein the step portion coupled to the first redistribution line is disposed farther from the cell region than the step portion coupled to the second redistribution line.

11. The semiconductor memory device according to claim 10, wherein a pitch of the plurality of step portions in the first direction is smaller than a pitch of the plurality of pass transistors in the first direction.

12. The semiconductor memory device according to claim 10, wherein the first redistribution line extends in the first direction to couple one of the plurality of step portions in the step region and one of the plurality of pass transistors in the cell region.

13. The semiconductor memory device according to claim 10,
wherein the first redistribution line is disposed in the first pad layer, and
wherein the first redistribution line comprises:
a land portion coupled to a contact extending in a second direction that is perpendicular to the top surface of the substrate, wherein the contact is coupled to one of the plurality of step portions; and
a line portion that couples one of the plurality of first pads to the land portion.

14. The semiconductor memory device according to claim 10, wherein the first redistribution line is disposed in the first pad layer, and is made of the same material as the first pads.

15. The semiconductor memory device according to claim 10,
wherein the first redistribution line is disposed in the second pad layer, and
wherein the first redistribution line comprises:
a land portion coupled to a contact extending in a second direction that is perpendicular to the top surface of the substrate, wherein the contact is coupled to one of the plurality of pass transistors; and a line portion that couples one of the plurality of second pads to the land portion.

16. The semiconductor memory device according to claim 10, wherein the first redistribution line is disposed in the second pad layer, and is made of the same material as the second pads.

17. The semiconductor memory device according to claim 10, further comprising:

a third redistribution line, disposed in a metal layer inside the circuit chip, that couples another of the plurality of pass transistors, excluding the pass transistor coupled to the first and the second redistribution lines, and another of the plurality of step portions, excluding the step portion coupled to the first and the second redistribution lines, wherein the step portions coupled to the first and the second redistribution lines are disposed closer to the cell region than the step portion coupled to the third redistribution line.

* * * * *